(12) United States Patent
Liu

(10) Patent No.: US 7,531,837 B2
(45) Date of Patent: May 12, 2009

(54) MULTI-CHANNEL THIN FILM TRANSISTOR STRUCTURE

(75) Inventor: Chuan-Feng Liu, Hsinchu (TW)

(73) Assignee: Prime View International Co., Ltd., Hsinchu (TW)

( * ) Notice: Subject to any disclaimer, the term of this patent is extended or adjusted under 35 U.S.C. 154(b) by 47 days.

(21) Appl. No.: 11/559,489

(22) Filed: Nov. 14, 2006

(65) Prior Publication Data

US 2007/0257260 A1    Nov. 8, 2007

(30) Foreign Application Priority Data

May 5, 2006    (TW)    ................ 95116147 A

(51) Int. Cl.
  *H01L 27/13*    (2006.01)
(52) U.S. Cl. .................. 257/59; 257/353; 257/354; 257/E27.111; 257/E27.112; 257/E27.113
(58) Field of Classification Search ............... 257/59, 257/353, 354, E27.111–E27.113
  See application file for complete search history.

(56) References Cited

U.S. PATENT DOCUMENTS

| 5,736,760 | A | | 4/1998 | Hieda et al. | |
|---|---|---|---|---|---|
| 6,025,218 | A | * | 2/2000 | Brotherton | ................ 438/166 |
| 6,771,346 | B2 | | 8/2004 | Sugimoto et al. | |
| 6,862,070 | B1 | | 3/2005 | Sugimoto et al. | |
| 2005/0045889 | A1 | | 3/2005 | Fryer et al. | |
| 2006/0046512 | A1 | * | 3/2006 | Nakamura et al. | ........... 438/770 |
| 2006/0202236 | A1 | * | 9/2006 | Lee | ............................. 257/224 |
| 2006/0231838 | A1 | * | 10/2006 | Kim | .............................. 257/59 |
| 2007/0015323 | A1 | * | 1/2007 | Isobe et al. | ................. 438/161 |

FOREIGN PATENT DOCUMENTS

| KR | WO 2005/054937 | * | 6/2005 |
|---|---|---|---|
| TW | I224234 | | 8/2003 |
| TW | 554193 | | 9/2003 |
| TW | 578298 | | 3/2004 |
| WO | 2005054937 A1 | | 6/2005 |

OTHER PUBLICATIONS

Taiwan Search Report of 95116147 dated May 28, 2008.

* cited by examiner

*Primary Examiner*—Marcos D. Pizarro
*Assistant Examiner*—Tifney L Skyles

(57) ABSTRACT

A multi-channel thin film transistor structure including a first conducting layer, an insulating layer, a semiconductor layer and a second conducting layer is provided. The first conducting layer formed on a substrate includes a gate electrode. The insulating layer covers the first conducting layer. The semiconductor layer formed on the insulating layer includes a plurality of semiconductor islands located above the gate electrode. The second conducting layer formed on the insulating layer and on the semiconductor layer includes a source electrode and a drain electrode. Each one of the semiconductor islands is coupled electrically with the source electrode at one end and coupled electrically with the drain electrode at the other end.

16 Claims, 4 Drawing Sheets

MULTI-CHANNEL THIN FILM TRANSISTOR STRUCTURE

RELATED APPLICATIONS

The present application is based on, and claims priority from, Taiwan Application Serial Number 95116147, filed May 5, 2006, the disclosure of which is hereby incorporated by reference herein in its entirety.

BACKGROUND

1. Field of Invention

The present invention relates to a thin film transistor structure, and more particularly, to a multi-channel thin film transistor structure.

2. Description of Related Art

There are two types of display architectures: passive matrix and active matrix. In general, a thin film transistor (TFT) can be used as a switching element to control each pixel individually in active matrix type displays. A threshold voltage shift of a TFT may occur due to a continuing positive bias stress or a positive bias stress with heavy-duty circle supplied at the TFT gate electrode. The threshold voltage shift may cause a decrease of the source-drain current and quality degradation of displays.

In organic light emitting diode (OLED) displays or polymer light emitting diode (PLED) displays, for example, each pixel has a switching TFT and a driving TFT. The switching TFT is for controlling a timing of supplying an electric current to a light emitting diode. The driving TFT is for supplying an electric current to the light emitting diode. In a driving TFT, interface degradation between a channel layer and an insulating layer may occur when a continuing positive bias stress is supplied at the gate electrode thereof. The threshold voltage shift due to the interface degradation may result in a decrease of the source-drain current and quantity reduction of the displays.

The threshold voltage shift has a serious effect on displays. Therefore, how to provide a thin film transistor structure to reduce the threshold voltage shift is an issue of great consequence.

SUMMARY

The present invention provides a multi-channel thin film transistor structure including a first conducting layer, an insulating layer, a semiconductor layer and a second conducting layer. The first conducting layer formed on a substrate includes a gate electrode. The insulating layer covers the first conducting layer. The semiconductor layer formed on the insulating layer includes a plurality of semiconductor islands located above the gate electrode. The second conducting layer formed on the insulating layer and on the semiconductor layer includes a source electrode and a drain electrode. Each one of the semiconductor islands is coupled electrically with the source electrode at one end and coupled electrically with the drain electrode at the other end.

The present invention also provides a multi-channel thin film transistor structure including a light-shielding layer, a first conducting layer, a semiconductor layer, an insulating layer and a second conducting layer. The light-shielding layer is formed on a substrate. The first conducting layer is formed on the light-shielding layer and on the substrate. The first conducting layer includes a source electrode and a drain electrode. The semiconductor layer is formed on the light-shielding layer and on the first conducting layer. The semiconductor layer includes a plurality of semiconductor islands. The insulating layer covers the semiconductor layer and the first conducting layer. The second conducting layer is formed on the insulating layer. The second conducting layer includes a gate electrode located above the semiconductor islands. Each one of the semiconductor islands is coupled electrically with the source electrode at one end and coupled electrically with the drain electrode at the other end.

According to preferred embodiments, the semiconductor layer is made of amorphous silicon.

According to preferred embodiments, each one of the semiconductor islands has a channel width (W) and a channel length (L).

According to preferred embodiments, the ratio of the channel width to the channel length (W/L) is about 7/4.

According to preferred embodiments, the semiconductor islands are identical in channel length and different in channel width.

According to preferred embodiments, the semiconductor layer includes a connection structure coupling the semiconductor islands electrically.

According to preferred embodiments, one of the source/drain electrodes is U-shaped, the other source/drain electrode has a protrusion portion located in the U-shaped electrode and the semiconductor islands are formed between the protrusion portion and the U-shaped electrode.

According to preferred embodiments, the semiconductor islands are formed two abreast.

According to the preferred embodiments mentioned above, the multi-channel TFT of the present invention has a plurality of parallel semiconductor islands to split the source-drain current into several parts. Thus, the threshold voltage shift of the multi-channel TFT can be reduced. Moreover, locating the semiconductors two abreast can further reduce the threshold voltage shift. Further, the multi-channel TFT of the present invention can be in the form of a bottom gate TFT or a top gate TFT. The semiconductor island can be made of amorphous silicon (a-Si). Hence, the multi-channel TFT of the present invention can be widely used.

It is to be understood that both the foregoing general description and the following detailed description are by examples and are intended to provide further explanations of the invention as claimed.

BRIEF DESCRIPTION OF THE DRAWINGS

These and other features, aspects and advantages of the invention will become apparent by reference to the following description and accompanying drawings, which are given by way of illustration only, and thus are not limitative of the invention, wherein.

DESCRIPTION OF THE PREFERRED EMBODIMENTS

Figure 1:
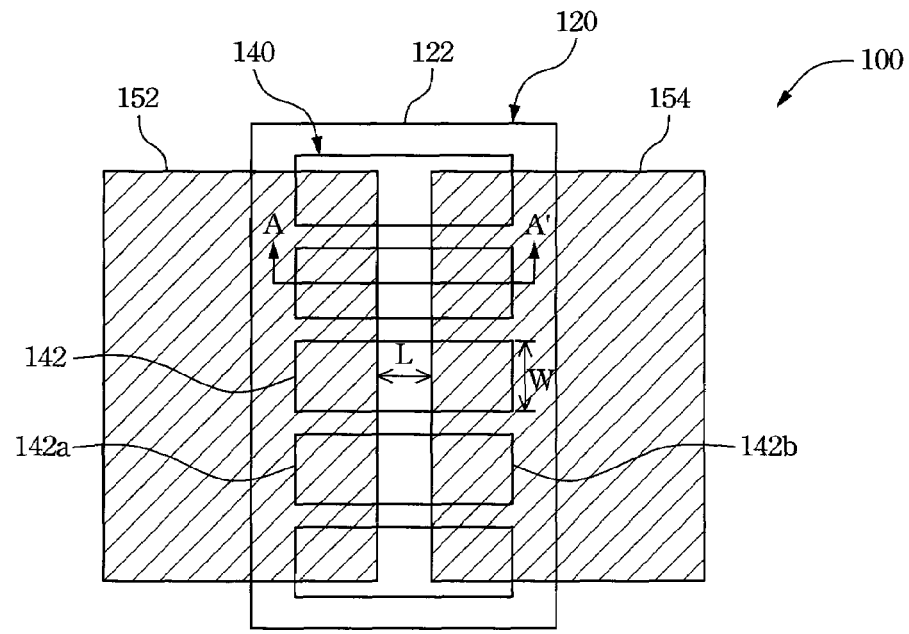
FIG. 1 illustrates a bottom gate TFT according to the preferred embodiment of the present invention.
Figure 2:
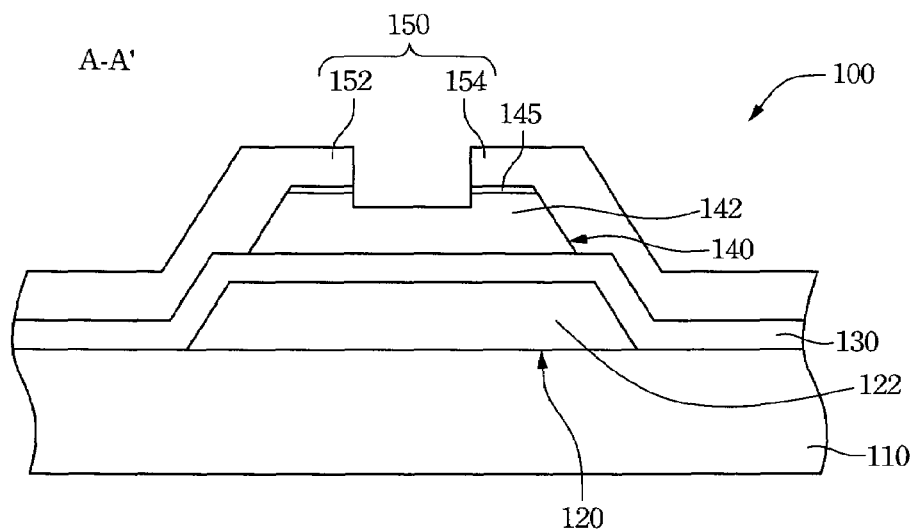
FIG. 2 illustrates a cross-sectional view from the A-A' line in FIG. 1.

FIG. 1 illustrates a bottom gate TFT according to the preferred embodiment of the present invention. FIG. 2 illustrates a cross-sectional view from the A-A' line in FIG. 1. Referring to FIG. 1 and FIG. 2, the TFT 100 can be a lo driving TFT of an OLED display or a PLED display. The TFT 100 includes a first conducting layer 120, an insulating layer 130, a semiconductor layer 140 and a second conducting layer 150. The first conducting layer 120 formed on a substrate 110 includes a gate electrode 122. The insulating layer 130 covers the first conducting layer 120. The semiconductor layer 140 is formed on the insulating layer 130. The semiconductor layer 140 includes a plurality of semiconductor islands 142 located above the gate electrode 122. The second conducting layer 150 is formed on the insulating layer 130 and on the semiconductor layer 140. The second conducting layer 150 includes a source electrode 152 and a drain electrode 154. A contact layer 145 is formed between the semiconductor layer 140 and the second conducting layer 150. Each one of the semiconductor islands 142 is coupled electrically with the source electrode 152 at one end 142a and coupled electrically with the drain electrode 154 at the other end 142b.

The substrate 110 of the TFT 100 can be made of glass. The first conducting layer 120 can be made of materials selected from the group consisting of chromium (Cr), wolfram (W), tantalum (Ta), titanium (Ti), molybdenum (Mo), aluminum (Al), copper (Cu), aluminum alloy and combinations thereof. The insulating layer 130 can be made of SiNx. The semiconductor layer 140 can be made of amorphous silicon (a-Si). The contact layer 145 can be an n-type layer. The second conducting layer 150 can be made of materials selected from the group consisting of chromium (Cr), wolfram (W), tantalum (Ta), titanium (Ti), molybdenum (Mo) and combinations thereof. The gate electrode 122, the semiconductor island 142, the source electrode 152 and the electrode 154 can be formed by a plurality of photolithography processes.

The TFT 100 has a channel structure including a plurality of parallel semiconductor islands 142. Each semiconductor island 142 has a channel width (W) and a channel length (L). In general, with a fixed-size channel structure, dividing the channel structure into more semiconductor islands 142 can reduce the threshold voltage shift because the source-drain current can be divided into more subdivisions. However difficulties arise when semiconductor islands 142 are narrow. Preferably, the TFT 100 includes five semiconductor islands with the same W/L ratio. The ratio of the channel width to the channel length (W/L) is about 7/4. The ratio of the channel width to the channel length of the channel structure is about 35/4. It is worth noting that the semiconductor islands 142 may be identical in channel length and different in channel width.

Figure 3:
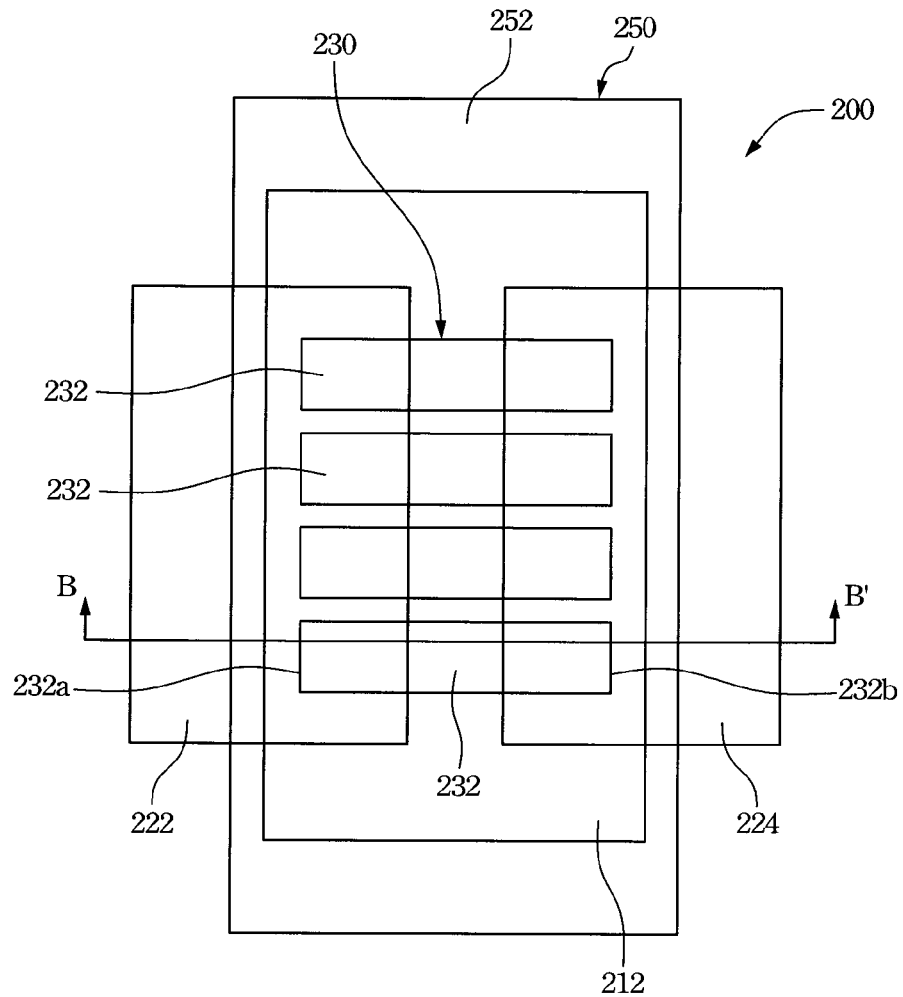
FIG. 3 illustrates a top gate TFT according to the preferred embodiment of the present invention.
Figure 4:
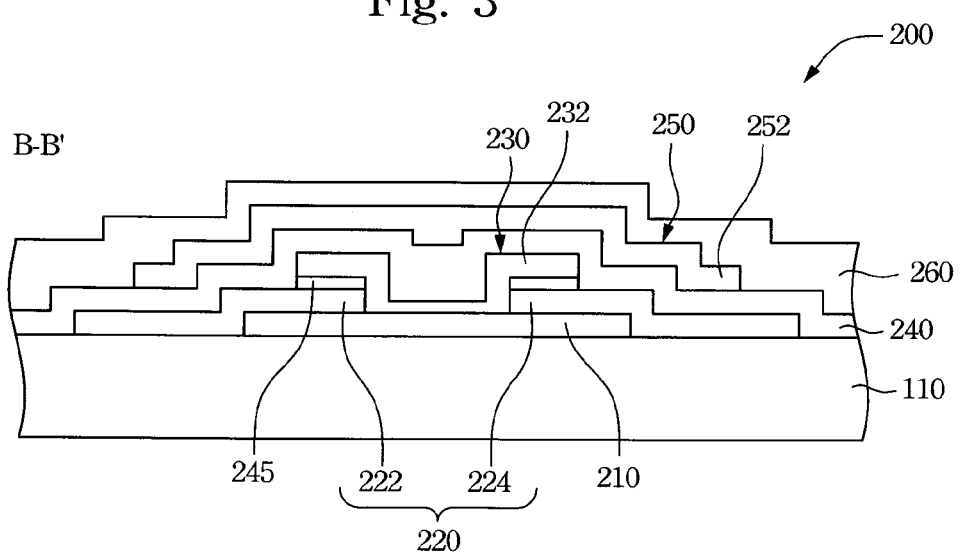
FIG. 4 illustrates a cross-sectional view from the B-B' line in FIG. 3.

FIG. 3 illustrates a top gate TFT according to the preferred embodiment of the present invention. FIG. 4 illustrates a cross-sectional view from the B-B' line in FIG. 3. Referring to FIG. 3 and FIG. 4, the TFT 200 includes a light-shielding layer 210, a first conducting layer 220, a semiconductor layer 230, a first insulating layer 240 and a second conducting layer 250. The light-shielding layer 210 is formed on a substrate 110. The light-shielding layer 210 includes a light-shielding structure 212. The first conducting layer 220 is formed on the light-shielding layer 210 and on the substrate 110. The first conducting layer 220 includes a source electrode 222 and a drain electrode 224. The semiconductor layer 230 is formed on the light-shielding layer 210 and on the first conducting layer 220. The semiconductor layer 230 includes a plurality of semiconductor islands 232. Each one of the semiconductor islands 232 is coupled electrically with the source electrode 222 at one end 232a and coupled electrically with the drain electrode 224 at the other end 232b. The first insulating layer 240 covers semiconductor layer 230 and the first conducting layer 220. The second conducting layer 250 is formed on the insulating layer 240. The second conducting layer 250 includes a gate electrode 252. The gate electrode 252 is above the semiconductor islands 232. The TFT 200 further includes a contact layer 245 and a second insulating layer 260. The contact layer 245 is formed between the first conducting layer 220 and the semiconductor layer 230. The insulating layer 260 covers the second conducting layer 250 and the first insulating layer 240.

The substrate 110 of the TFT 200 can be made of glass. The first conducting layer 220 can be made of materials selected from the group consisting of chromium (Cr), wolfram (W), tantalum (Ta), titanium (Ti), molybdenum (Mo), aluminum (Al), copper (Cu), aluminum alloy and combinations thereof. The semiconductor layer 230 can be made of amorphous silicon (a-Si). The first insulating layer 240 and the second insulating layer 260 can be made of SiNx. The second conducting layer 150 can be made of materials selected from the group consisting of chromium (Cr), wolfram (W), tantalum (Ta), titanium (Ti), molybdenum (Mo) and combinations thereof. The contact layer 245 can be an n-type layer. The light-shielding structure 212 can be made of resin, chromium (Cr), wolfram (W), tantalum (Ta), titanium (Ti), molybdenum (Mo) and combinations thereof.

Figure 5:
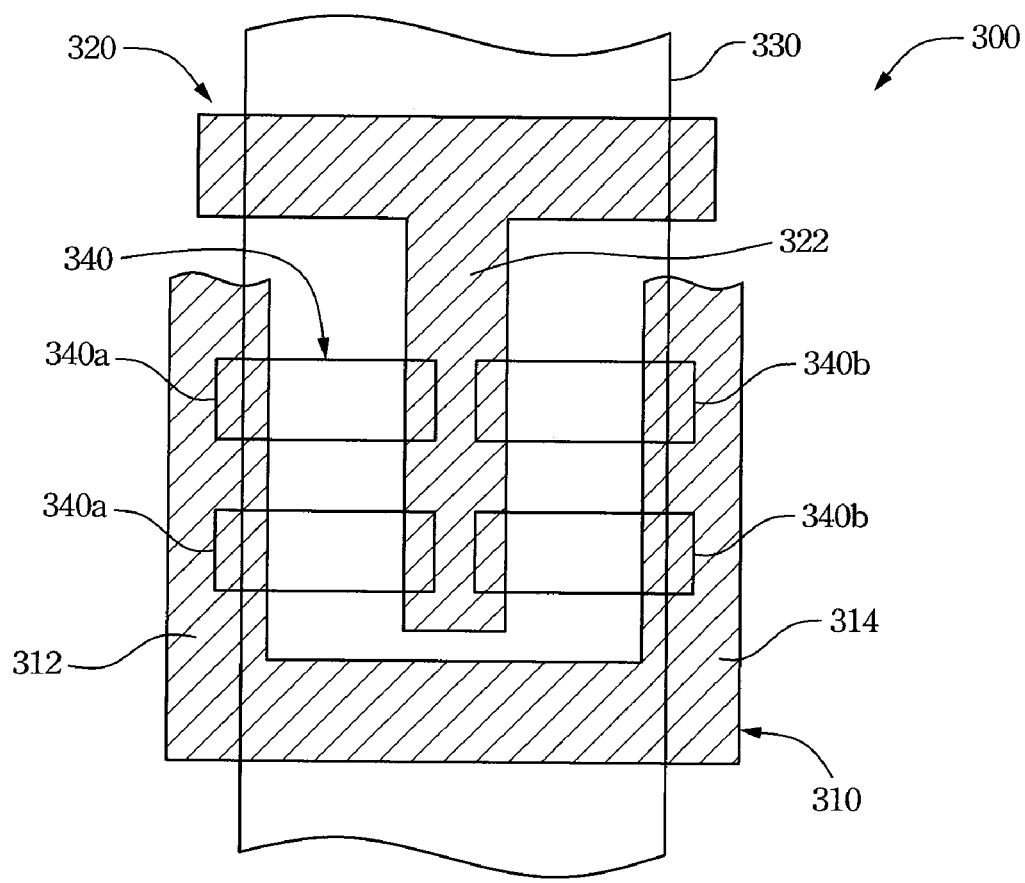
FIG. 5 illustrates a TFT according to another preferred embodiment of the present invention.

FIG. 5 illustrates a TFT according to another preferred embodiment of the present invention. The TFT 300 can be a bottom gate TFT as shown in FIG. 2 or a top gate TFT as shown in FIG. 4. More specifically, one of the source/drain electrodes is U-shaped, the other electrode has a protrusion portion located in the U-shaped electrode and the semiconductor islands are formed between the protrusion portion and the U-shaped electrode. The TFT 300 is, for example, a bottom gate TFT and includes a gate electrode 330, a plurality of semiconductor islands 340, a source electrode 310 and a drain electrode 320. The source electrode 310 is U-shaped and the drain electrode 320 has a protrusion portion 322. The protrusion portion 322 is located in the U-shaped electrode 310. The semiconductor island 340 may be formed between the protrusion portion 322 and the U-shaped electrode 310 two abreast. The first columns of the semiconductor islands 340a are coupled electrically with the protrusion portion 322 and one end 312 of the U-shaped electrode 310. The second column of semiconductor islands 340b are coupled electrically with the protrusion portion 322 and the other end 314 of the U-shaped electrode 310. Thus, more semiconductor islands 340 can be disposed in the TFT 300 and the threshold voltage shift can be reduced because the source-drain current is divided into more subdivisions.

Figure 6:
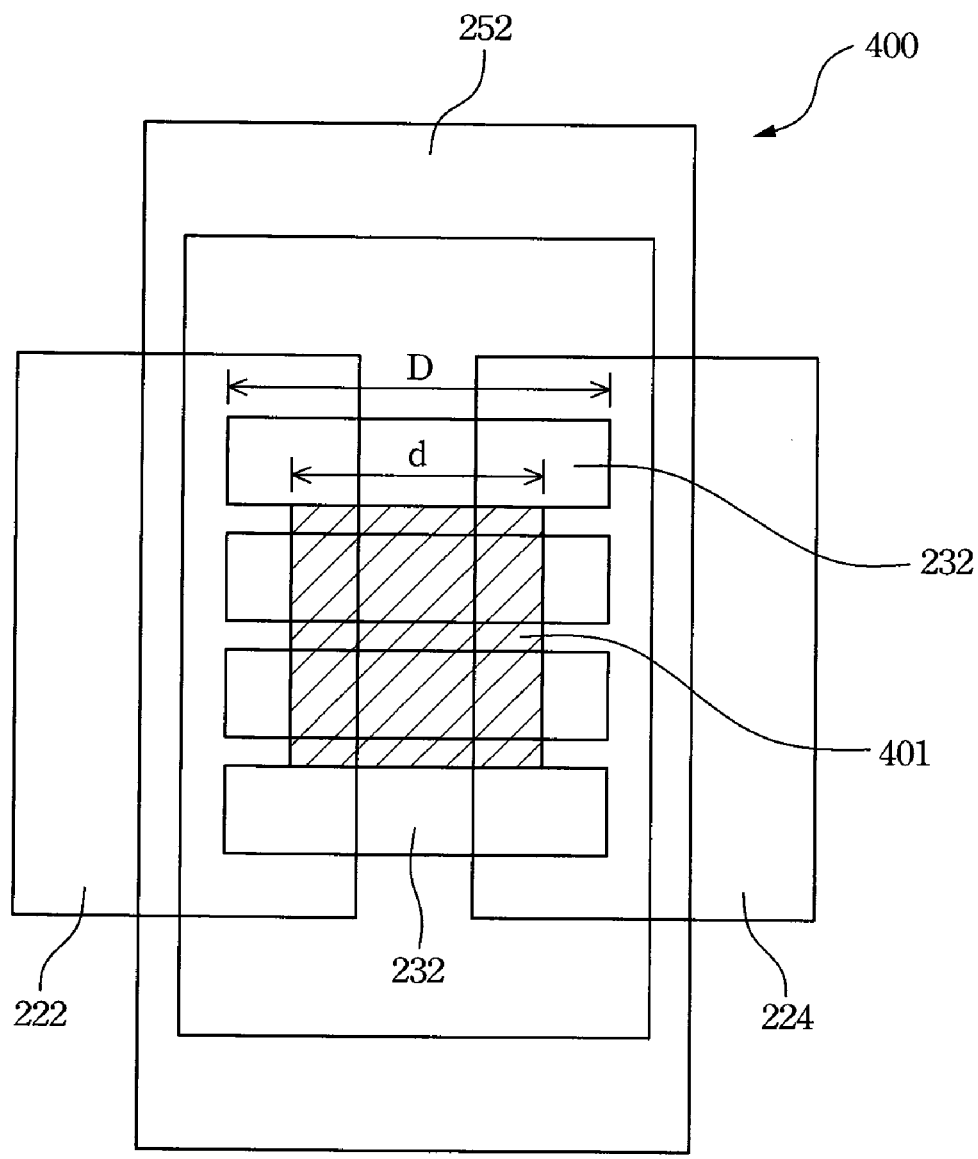
FIG. 6 illustrates a TFT according to yet another preferred embodiment of the present invention.

FIG. 6 illustrates a TFT according to yet another preferred embodiment of the present invention. The TFT 400 can be in the form of a bottom gate TFT as shown in FIG. 2 or in the form of a top gate TFT as shown in FIG. 4. The TFT 400 is, for example, a top gate TFT and includes a gate electrode 252, a plurality of semiconductor islands 232, a source electrode 222 and a drain electrode 224. The semiconductor layer further includes a connection structure 401 to couple electrically at least two semiconductor islands 232. The width (d) of the connection structure 401 is less than width (D) of the semiconductor island 232. The structure of the TFT 400 can also split the source-drain current into several parts and reduce the threshold voltage shift.

It should be noted that the present invention is not intended to be limited to the embodiment. The multi-channel TFT of the present invention not only can be a driving TFT of OLED displays or PLED displays. It also can be a TFT with a continuing, heavy-duty circle positive bias stress at the gate electrode terminal. For example, driver circuits monolithically integrated on glass can use the multi-channel TFT of the present invention to reduce the threshold voltage shift.

According to preferred embodiments mentioned above, the multi-channel TFT of the present invention has the following advantages. The threshold voltage shift can be reduced because the multi-channel TFT of the present invention has a plurality of parallel semiconductor islands to split the source-drain current into several parts. Moreover, locating the semiconductor two abreast can further reduce the threshold voltage shift. Further, the multi-channel TFT of the present invention can be in the form of a bottom gate TFT or a top gate TFT. The semiconductor island can be made of amorphous silicon (a-Si). Hence, the multi-channel TFT of the present invention can be widely used.

While the invention has been described by way of example and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A multi-channel thin film transistor comprising:
    a single gate electrode for a thin film transistor, formed on a substrate;
    an insulating layer, covering the single gate electrode;
    a semiconductor layer, formed on the insulating layer, including a plurality of parallel semiconductor islands located above the single gate electrode together; and
    a single source electrode and a single drain electrode for the thin film transistor, formed on the insulating layer and on the semiconductor layer,
    wherein the single source electrode for the thin film transistor is coupled electrically with one end of all of the semiconductor islands, and the single drain electrode for the thin film transistor is coupled electrically with the other end of all of the semiconductor islands.

2. A multi-channel thin film transistor as recited in claim 1, wherein the semiconductor layer is made of amorphous silicon.

3. A multi-channel thin film transistor as recited in claim 1, wherein each one of the semiconductor islands has a channel width (W) and a channel length (L).

4. A multi-channel thin film transistor as recited in claim 3, wherein the ratio of the channel width to the channel length (W/L) is about 7/4.

5. A multi-channel thin film transistor as recited in claim 3, wherein the semiconductor islands are identical in channel length and different in channel width.

6. A multi-channel thin film transistor as recited in claim 1, wherein the semiconductor layer includes a connection structure coupling the semiconductor islands electrically.

7. A multi-channel thin film transistor as recited in claim 1, wherein one of the source/drain electrodes is U-shaped, the other electrode has a protrusion portion located in the U-shaped electrode and the semiconductor islands are formed between the protrusion portion and the U-shaped electrode.

8. A multi-channel thin film transistor as recited in claim 7, wherein the semiconductor islands are formed two abreast.

9. A multi-channel thin film transistor comprising:
    a light-shielding layer formed on a substrate;
    a single source electrode and a single drain electrode for a thin film transistor, formed on the light-shielding layer;
    a semiconductor layer, formed on the light-shielding layer and on the single source electrode and the single drain electrode, including a plurality of parallel semiconductor islands located above the single source electrode and the single drain electrode together;
    an insulating layer, covering the semiconductor layer and the single source electrode and the single drain electrode; and
    a single gate electrode for the thin film transistor, formed on the insulating layer, the single gate electrode located above all of the semiconductor islands;
    wherein all of the semiconductor islands are coupled electrically with the single source electrode at one end and coupled electrically with the single drain electrode at the other end.

10. A multi-channel thin film transistor as recited in claim 9, wherein each one of the semiconductor layer is made of amorphous silicon.

11. A multi-channel thin film transistor as recited in claim 9, wherein each one of the semiconductor islands has a channel width (W) and a channel length (L).

12. A multi-channel thin film transistor as recited in claim 11, wherein the ratio of the channel width to the channel length (W/L) is about 7/4.

13. A multi-channel thin film transistor as recited in claim 11, wherein the semiconductor islands are identical in channel length and different in channel width.

14. A multi-channel thin film transistor as recited in claim 9, wherein the semiconductor layer includes a connection structure coupling the semiconductor islands electrically.

15. A multi-channel thin film transistor as recited in claim 9, wherein one of the source/drain electrodes is U-shaped, the other electrode has a protrusion portion located in the U-shaped electrode and the semiconductor islands are formed between the protrusion portion and the U-shaped electrode.

16. A multi-channel thin film transistor as recited in claim 15, wherein the semiconductor islands are formed two abreast.

* * * * *